(12) United States Patent
Mohan et al.

(10) Patent No.: US 7,692,565 B2
(45) Date of Patent: Apr. 6, 2010

(54) SYSTEMS AND METHODS FOR PERFORMING OFF-CHIP DATA COMMUNICATIONS AT A HIGH DATA RATE

(75) Inventors: Vivek Mohan, San Diego, CA (US); Abhay Dixit, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 47 days.

(21) Appl. No.: 12/105,152

(22) Filed: Apr. 17, 2008

(65) Prior Publication Data

US 2009/0021405 A1 Jan. 22, 2009

Related U.S. Application Data

(60) Provisional application No. 60/912,619, filed on Apr. 18, 2007.

(51) Int. Cl.
*H03M 9/00* (2006.01)
(52) U.S. Cl. .................................. 341/101; 341/100
(58) Field of Classification Search .................. 341/101, 341/141, 155, 144, 100
See application file for complete search history.

(56) References Cited

U.S. PATENT DOCUMENTS

| | | | |
|---|---|---|---|
| 5,519,726 A | 5/1996 | Kuo | |
| 5,530,487 A * | 6/1996 | den Hollander | 348/692 |
| 6,351,138 B1 | 2/2002 | Wong | |
| 2005/0088724 A1* | 4/2005 | Lee et al. | 359/333 |
| 2007/0024737 A1* | 2/2007 | Nakamura et al. | 348/335 |

FOREIGN PATENT DOCUMENTS

| | | |
|---|---|---|
| WO | 2006102666 | 9/2006 |
| WO | 2007033305 | 3/2007 |

OTHER PUBLICATIONS

International Search Report—PCT/US08/060770—International Search Authority, European Patent Office—Oct. 8, 2008.
Written Opinion—PCT/US08/060770—International Search Authority, European Patent Office—Oct. 8, 2008.

\* cited by examiner

*Primary Examiner*—Brian Young
(74) *Attorney, Agent, or Firm*—Jiayu Xu

(57) ABSTRACT

An electronic device is described. The electronic device includes a first integrated circuit (IC) and a second integrated circuit (IC). The electronic device also includes a multiplexer configured to multiplex a parallel data signal into a serial data signal, and a transmitter configured to transmit the serial data signal from the first IC to the second IC. The electronic device further includes a receiver configured to receive the serial data signal. The receiver includes a clamp circuit configured to clamp the voltage swing of an analog node within a determined range. The clamp also helps to extend the bandwidth of the receiver.

31 Claims, 11 Drawing Sheets

SYSTEMS AND METHODS FOR PERFORMING OFF-CHIP DATA COMMUNICATIONS AT A HIGH DATA RATE

CLAIM OF PRIORITY UNDER 35 U.S.C. §119

This application is related to and claims priority from U.S. Provisional Patent Application Ser. No. 60/912,619 filed Apr. 18, 2007, for HIGH SPEED LOW POWER LOW DUTY CYCLE DISTORTION DIFFERENTIAL RECEIVER, with inventors Vivek Mohan and Dixit Abhay which is incorporated herein by reference.

TECHNICAL FIELD

The present systems and methods relate to communication and wireless-related technologies. In particular, the present systems and methods relate to systems and methods for performing off-chip data communications at a high data rate.

BACKGROUND

Communication devices have become smaller and more powerful in order to meet consumer needs and to improve portability and convenience. Consumers have become dependent upon communication devices such as cellular telephones, personal digital assistants (PDAs), laptop computers, display devices, digital subscriber line (DSL) modems, and the like. Consumers have come to expect reliable service, expanded areas of coverage, and increased functionality. Wireless communication devices may be referred to as mobile stations, stations, access terminals, user terminals, terminals, subscriber units, user equipment, etc.

A communication system may simultaneously support communication for multiple communication devices. In one example, a wireless communication device may communicate with one or more base stations (which may alternatively be referred to as access points, Node Bs, etc.) via transmissions on the uplink and the downlink. The uplink (or reverse link) refers to the communication link from the wireless communication devices to the base stations, and the downlink (or forward link) refers to the communication link from the base stations to the wireless communication devices.

Wireless communication systems may be multiple-access systems capable of supporting communication with multiple users by sharing the available system resources (e.g., bandwidth and transmit power). Examples of such multiple-access systems include Code Division Multiple Access (CDMA) systems, Wideband Code Division Multiple Access (WCDMA), Time Division Multiple Access (TDMA) systems, Global System for Mobile Communications (GSM), Frequency Division Multiple Access (FDMA) systems, and Orthogonal Frequency Division Multiple Access (OFDMA) systems.

Communication of data from one circuit within a device to another circuit within the device may occur in some or all of the communication devices, such as, for example ultra-mobile personal computers (UMPCs). Smaller integrated circuits are needed as the size of these devices decrease. However, as the geometry of the circuits decrease, the difficulty in off-chip communications at a high rate with low power and low jitter increases. Jitter may refer to a measurement of the variation from when an output signal is produced and when the output signal was expected to be produced. As such, benefits may be realized by providing systems and methods for performing off-chip data communications at a high data rate.

DETAILED DESCRIPTION

Figure 1:
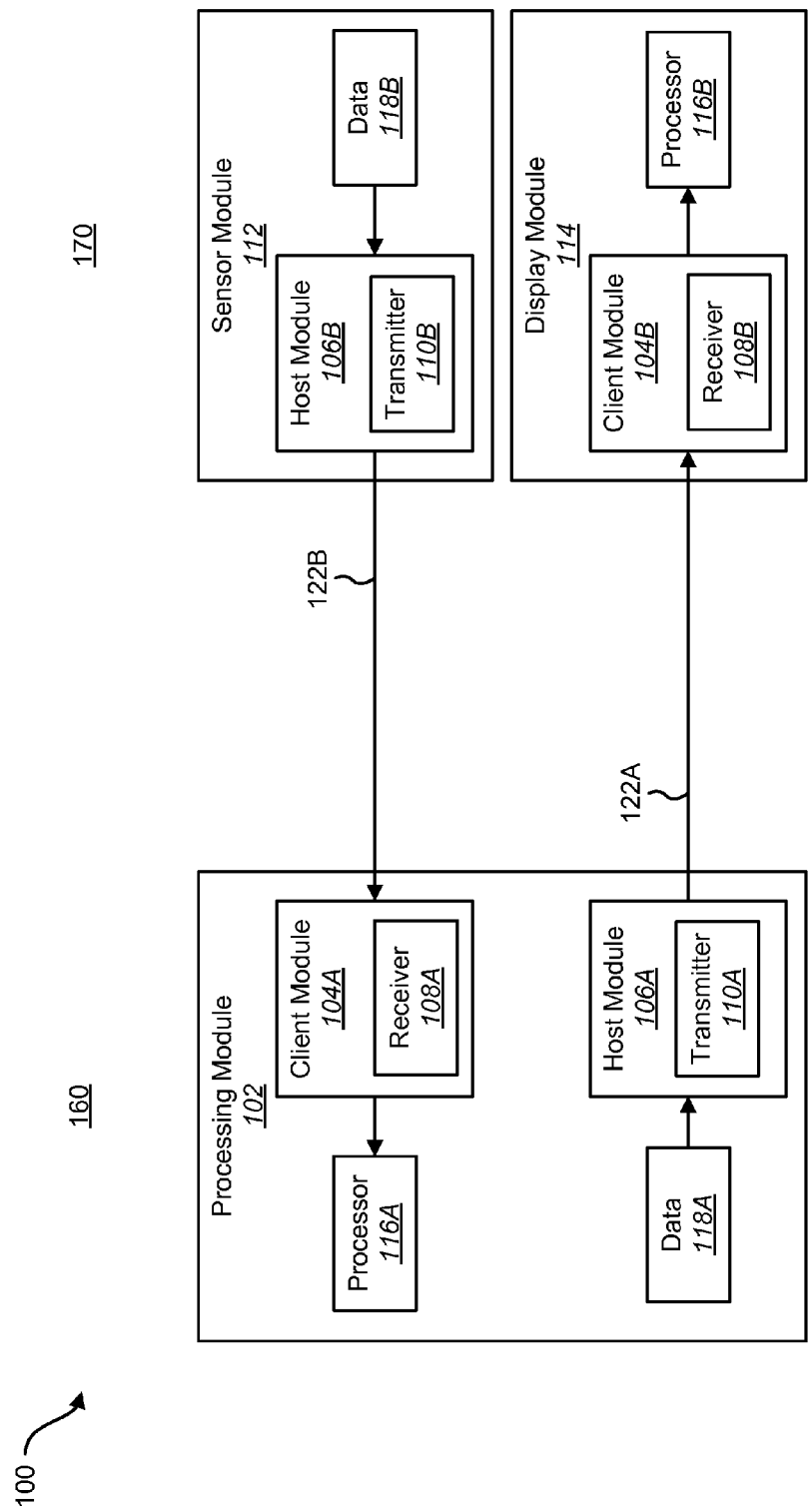
FIG. 1 is a block diagram illustrating one example of a device in accordance with the present systems and methods.

Data may be communicated to/from one integrated circuit (IC) from/to another IC within a single device or between different devices. An IC may be referred to as a silicon chip. Data communications between different ICs may be referred to as off-chip data communication. Traditional off-chip data communication techniques use parallel low speed complementary metal-oxide-semiconductor (CMOS) data lines. However, this traditional technique has many shortcomings. For example, this traditional technique occupies a large amount of the IC surface area. In addition, it also requires more package pins. As a result, the silicon costs and the packaging costs increase. A smaller surface area implies that there is little room on the IC to add additional elements that perform other functions.

In addition, electronic devices are becoming smaller. For example, some wireless communication devices (e.g., cellular phones) are in "flip form" in order to decrease the overall size of the device. As an example, a cellular phone in "flip form" may be referred to as a flip-phone. A first portion of the phone may "flip" open and closed from a second portion of the phone. The first portion may include a display. The second portion may include a keypad. The component connecting the first portion and the second portion may be referred to as a knuckle. During off-chip communications, a first IC in the first portion of the phone may send/receive data to/from a second IC in the second portion of the phone. The wires connecting the first IC and the second IC pass through the knuckle. Using the traditional technique described above, it is becoming increasingly difficult to use multiple parallel lines (i.e., wires) to pass through the small knuckle area.

Some techniques have shifted towards using a serial high speed data line for off-chip data communications. A serial high speed data line may minimize the number of wires used to communicate data between different ICs within a device. A receiving IC may implement an on-chip serial to parallel conversion in order to feed data via parallel lines to a microprocessor. The microprocessor may be located on the receiving IC.

However, with the increased data rate for serial data lines, CMOS rail-to-rail drivers may not operate at such a high data rate. Thus, there is a need for a high speed and low power serial line. A low power, low jitter high-speed receiver is an important component of that serial line. Jitter may refer to a measurement of the variation from when an output signal is produced and when the output signal was expected to be produced. Existing industry solutions use a large amount of current. The high use of current may not be a disadvantage for backplane, alternative current (AC) outlet desktop applications because the large amount of current is not a draw on the power supply.

However, burning a large quantity of current is cumbersome for battery operated handheld devices. The present systems and methods outline a high speed, low power and low jitter design for a receiver. The receiver may be implemented on one or more ICs within a device.

An electronic device is described. The electronic device includes a first integrated circuit (IC) and a second integrated circuit (IC). The electronic device also includes a multiplexer configured to multiplex a parallel data signal into a serial data signal, and a transmitter configured to transmit the serial data signal from the first IC to the second IC. The electronic device further includes a receiver configured to receive the serial data signal. The receiver includes a clamp circuit configured to clamp the voltage swing of an analog node within a determined range. The clamp also helps to extend the bandwidth of the receiver.

A method for performing off-chip data communications is also described. Parallel data signals are multiplexed into a serial data signal. The serial data signal is transmitted from a first chip to a second chip. At the second chip, the receiver processes the received data. A clamp circuit in the receiver circuit clamps the voltage swing associated with an analog node within a determined voltage range. This helps cascode transistors in output stage of the receiver going out of saturation. The clamp also helps extend the bandwidth of a receiver. Serial data output from the receiver is demultiplexed into the parallel data signals. The parallel data signals are processed by the processor.

An apparatus is also described. The apparatus includes means for multiplexing parallel data signals into a serial data signal and means for transmitting the serial data signal from a first chip to a second chip. The apparatus also includes means for clamping a voltage output swing associated with an analog node within a determined voltage range. This also extends the bandwidth of a receiver. The apparatus further includes means for demultiplexing the serial data signal into the parallel data signals and means for processing the parallel data signals.

An integrated circuit for performing off-chip data communications is also described. The integrated circuit includes a receiver configured to receive a serial data signal. The receiver includes a clamp circuit configured to bias an analog node within the receiver and clamp a voltage swing associated with the analog node within a determined voltage range. This also extends the bandwidth of the receiver. The receiver further includes a programmable current leakage circuit configured to prevent cascode output stage devices of the receiver from entering a deep cut-off region. In addition, the receiver includes a delay element configured to clamp the output of the receiver at a logic low until internal receiver nodes approach a corresponding quiescent point and the receiver bias current approaches a quiescent value.

FIG. 1 is a block diagram illustrating one example of a device 100 in accordance with the present systems and methods. The device 100 may be any kind of electronic device including, but not limited to, a wireless communications device, a media processor, a PDA, a cellular phone, etc. The present systems and methods provide a receiver to be used for data communications between different parts of the electronic device 100 (e.g., between different ICs, chips, circuits, etc.). Referring now to the diagram of FIG. 1, a first section 160 may include a processing module 102 and a second section 170 may include a sensor module 112 and a display module 114. In one configuration, the processing module 102 may be a central processing unit (CPU), a microcontroller IC, a mobile station modem (MSM), etc.

In one configuration, the sensor module 112 may be an image capturing module, such as a camera. In addition, the sensor module 112 may be a global positioning system (GPS) module or any other type of module that may transmit data at a high rate to the processing module 102. The sensor module 112 may include a host module 106B that includes a transmitter 110B. The transmitter 110B may transmit data 118B to the processing module 102. The data 118B may be transmitted via one or more wires 122B. The processing module 102 may include a processor 116A and a client module 104A. The client module 104A may also include a receiver 108A to receive the data 118B. The processor 116A may process the data 118B.

In addition, the processing module 102 may include a host module 106A with a transmitter 110A. The transmitter 110A may transmit data 118A to the display module 114. In one configuration, the display module 114 may be a liquid crystal display (LCD). The processing module 102 may transmit the data 118A to the display 114 using one or more wires 122A. The display module 114 may include a client module 104B with a receiver 108B that receives the data 118A. A processor 116B may process the received data 118A. The combination of the elements within each section 160, 170 may each be referred to as a wireline transceiver because the elements within each section 160, 170 are connected by a wire, cable, etc.

Figure 2:
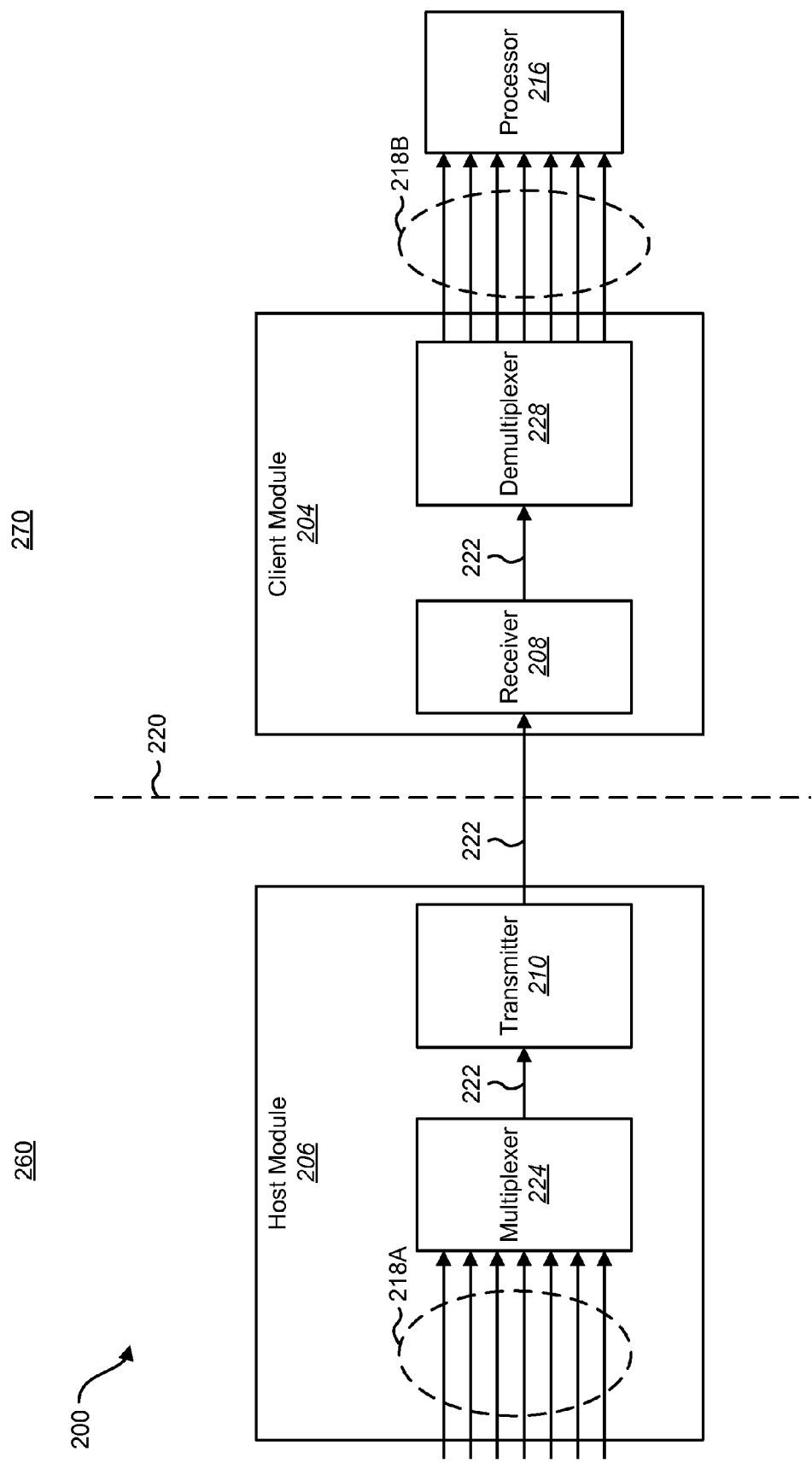
FIG. 2 is another configuration of a device in accordance with one example of the present systems and methods.

FIG. 2 is another configuration of a device 200 in accordance with one example of the present systems and methods. In one configuration, the device 200 may have a "flipping" capability (e.g., the device may open and close). The device 200 may include a main display and a sub-display. A first section 260 and a second section 270 of the device 200 may be connected by a connector 220. The connector 220 may be referred to as a knuckle. The second section 270 may rotate around the axis of the connector 220 in a first direction and rest on the first section 260. The device 200 may be flipped open by rotating the second section 270 around the axis of the connector 220 in a second direction. In one example, the first direction is opposite from the second direction. In some examples, the sub-display may be used and it may not be necessary to flip open the device in order to activate the device. In other configurations, the device 200 may not include a "flipping" capability. Non-flipping devices 200 may include a display and a sub-display. Non-flipping devices may not need to be flipped open in order to be activated.

A host module 206 may include a multiplexer 224. The multiplexer 224 may convert parallel data lines 218A to a serial data line 222. In one configuration, the multiplexer 224 may be a serializer.

The serial data line 222 may be a differential line of two wires (i.e., a positive line and a negative line). Each parallel data line may carry a certain amount of data at the same time. For example, if there is 1 gigabit of data, ten parallel data lines may each carry 100 megabits of the data. A serial data line may carry one or more bits of the data at one time, sequentially. There may be multiple serial data lines.

A transmitter 210 may transmit data via the serial data lines 222 through a connector 220. A client module 204 may include a receiver 208 that receives the data on the serial data lines 222. A demultiplexer 228 may demultiplex the serial data lines 222 to the parallel data lines 218B. In one configuration, the demultiplexer 228 may be a deserializer. In a further configuration, the demultiplexer 228 may be a clock and data recovery (CDR) circuit. The receiver 208 may send the serial data line 222 to the CDR circuit which converts the serial data lines 222 to parallel data lines 218B. The CDR may be synchronized with a clock associated with the multiplexer 224 so that the serial data lines 222 may be converted to parallel data lines 218B. In one example, information regarding the clock associated with the multiplexer 224 is sent to the CDR with the data. Alternatively, the clock may be encoded together with the data sent on the serial data line 222. The CDR may decode the clock, sync up with the decoded clock and convert the serial data line 222 to parallel data lines 218B. In one configuration, data may be sent on one line of the serial data line 222 and a strobe line may be sent on a second serial data line 222. The CDR may use the strobe line to decode the clock information. The parallel data lines 218B may be connected to a processor 216 which processes the data.

Figure 3:
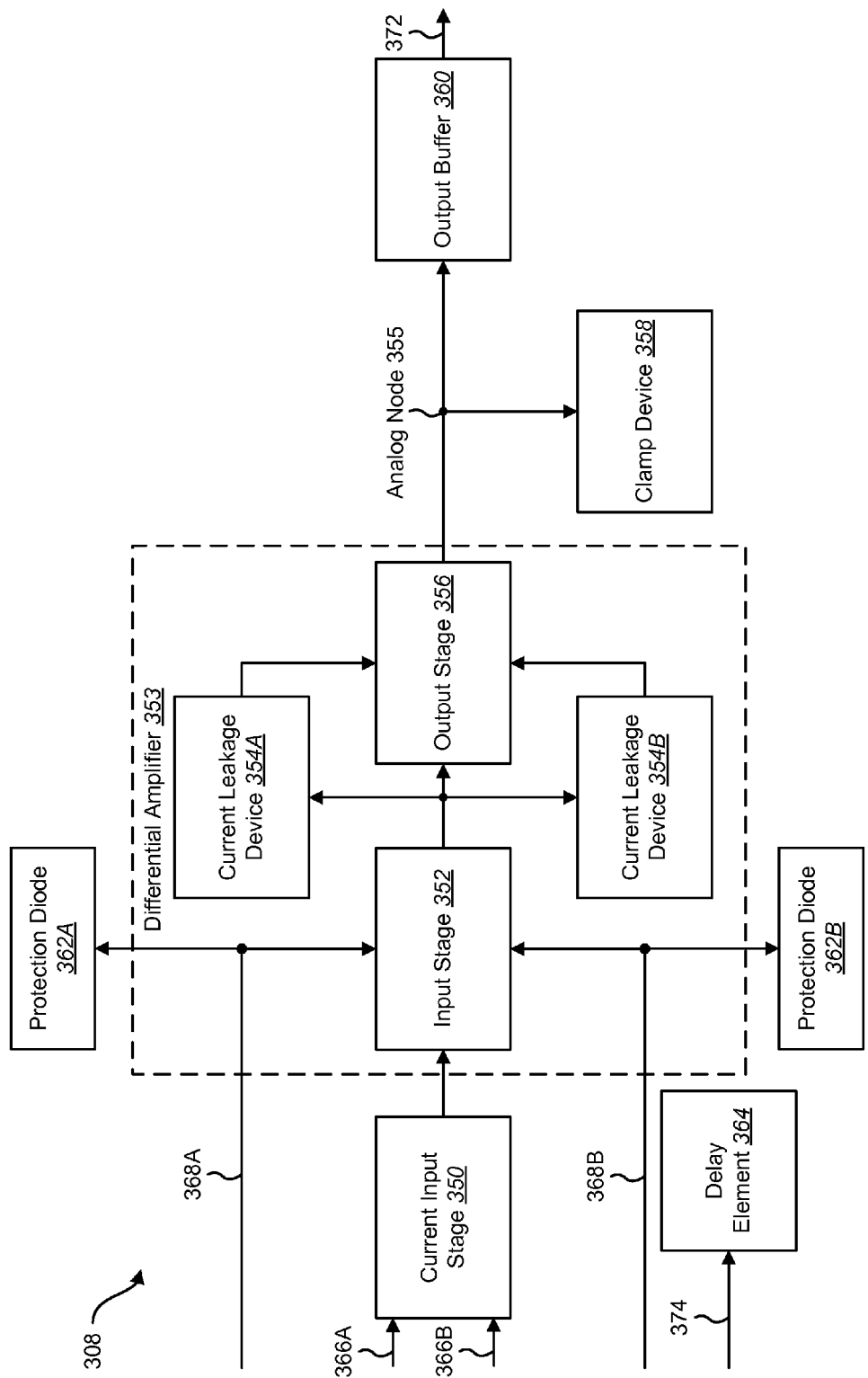
FIG. 3 is one configuration of a receiver in accordance with the present systems and methods.

FIG. 3 is one configuration of a receiver 308 in accordance with the present systems and methods. In one example, a first bias current source 366A and a second bias current source 366B are input to a current input stage 350. This current may serve as bias current for an entire differential amplifier 353. In addition, a first voltage source 368A and a second voltage source 368B are input to an input stage 352 of the differential amplifier 353. The first and second voltage source 368A, 368B may be a differential voltage signal. In one configuration, the differential voltage signal may have a voltage swing of around 50 milli-volts (mV) to 70 mV.

In one configuration, the first and second voltage source 368A, 368B are a differential low voltage source. Differential low voltage signaling schemes may be used in order to reject any common mode noise that may be present in the environment of the device 100.

The current leakage device 354A, 354B may be a programmable leakage device and receive, as input, the output of the input stage 352 of the differential amplifier 353. The current leakage device 354A, 354B may bleed some current to an output stage 356 and thus assist the output stage 356 cascode devices going into a deep cut-off region. The deep cut-off region may degrade the high speed operation of the differential amplifier 353. The output stage 356 may further be connected to a clamp device 358. The clamp device 358 may bias an analog node 355 within the receiver and clamp the output swing voltage produced from the output stage 356. The analog node 355 may be between the output stage 356 and an output buffer 360. The node 355 may be a sensitive node. Any capacitance on the analog node 355 may produce a low frequency pole, limiting the bandwidth of the amplifier 353. The clamp device 358 may help to reduce the capacitance load on the analog node 355 and also offer low output impedance increasing the bandwidth of the receiver.

Details regarding the current leakage device 354A, 354B and the clamp device 358 are provided below. An output buffer 360 may be connected to the clamp device 358 and the output buffer 360 may drive an output serial data signal 372 for further processing. The output signal 372 may be a single ended CMOS output. In one example, the output serial data signal 372 is provided to a demultiplexer 228 which converts the serial data signal 372 to parallel data signals, as previously explained.

In addition, the receiver 308 may also include a delay element 364 and protection diodes 362A, 362B. The protection diodes 362A, 362B may protect the elements of the receiver 308 from damaging electrostatic discharge (ESD) pulses. The protection diodes 362A, 362B may be a charge device model (CDM) ESD protection circuit. In one example, an enabling signal 374 may be input to the delay element. The delay element 364 may hold the output signal 372 of the receiver 308 at a logic low for a determined period of time. In one example, an input signal, including differential voltage signals 368A, 368B, is input to the protection diodes 362A, 362B.

In one configuration, the receiver 308 may be one of the elements of Mobile Digital Display Interface (MDDI) physical layer (PHY). However, MDDI is just one example of the type of interface used with the receiver 308. The receiver 308 may be used during standard link operation. The receiver 308 may convert differential low voltage signals to a single ended CMOS output. In one example, the speed of operation for the receiver 308 may be greater than one gigabit per second (Gbps). In addition, the common mode input range (Vcm) for the receiver 308 may be rail-to-rail. In some configurations, sub-hundred duty cycle distortion (DCD) and jitter is introduced for rail-to-rail common mode operation. In a further example, the receiver 308 may include a minimum differential input swing of 50 mV. The differential input swing provides a measurement of the sensitivity of the receiver 308.

In one example, the input sensitivity of the receiver 308 may be less than 50 mV and the current consumption of the receiver 308 may be less than 500 micro amps (uA). In one configuration, the operating input voltage 368A, 368B may be 1.65V to 1.95V for pad power and 1.08V to 1.45V for core power. The core power may be used to obtain the level translated CMOS output from the receiver 308. The operating temperature range for the receiver 308 may be from −40° Celsius (C) to 125° C.

The design of the receiver 308 may incorporate both a p-type metal-oxide-semiconductor (PMOS) field effect transistor and an n-type metal-oxide-semiconductor (NMOS) field effect transistor input pair along with corresponding tail sources. This complementary input allows the receiver amplifier to have a wide common mode input range. The differential output currents of this input pair may be folded and mirrored to perform differential to singe ended conversion. The input devices may operate in the weak inversion region to minimize receiver offset. The tail sources may accommodate the rail-to-rail common mode input range of the signal (i.e., at least 0.475 V to 1.475 V). In one example, the common mode range may be limited by the power supply rails.

At a low pad power supply of 1.65V and a mid common mode input signal, due to a high Vt (the threshold voltage) of thick oxide devices, both the tail current sources serving the PMOS and NMOS differential pair may exit saturation causing a reduced current in the differential pair and a reduced current in the output stage 356. This may cause inefficiencies for the high speed operation and may cause bits of data to be missing in the output. A thin oxide NMOS and PMOS differential pair (further explained below in FIG. 5) may be used to avoid these inefficiencies.

Figure 4:
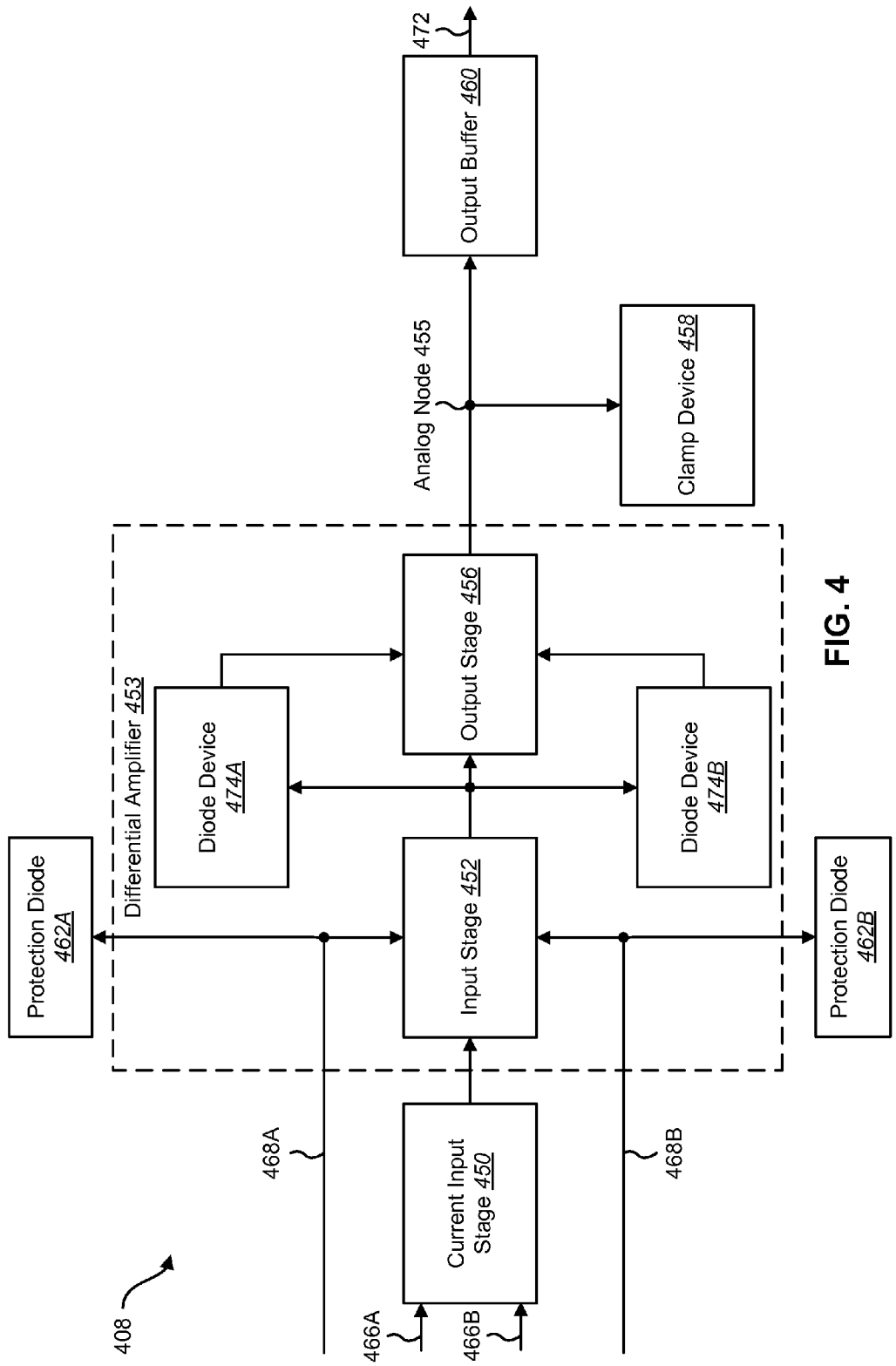
FIG. 4 is block diagram illustrating another configuration of a receiver.

FIG. 4 is block diagram illustrating another configuration of a receiver 408. The configuration of the receiver 408 is similar to the configuration of the receiver 308 illustrated in FIG. 3. However, the present example includes diode devices 474A, 474B instead of current leakage devices 354A, 354B. The diode devices 474A, 474B may also assist an output stage 456 with cascading devices avoid going into a deep cut-off region. The deep cut-off region may degrade the high speed operation of the amplifier.

Figure 5:
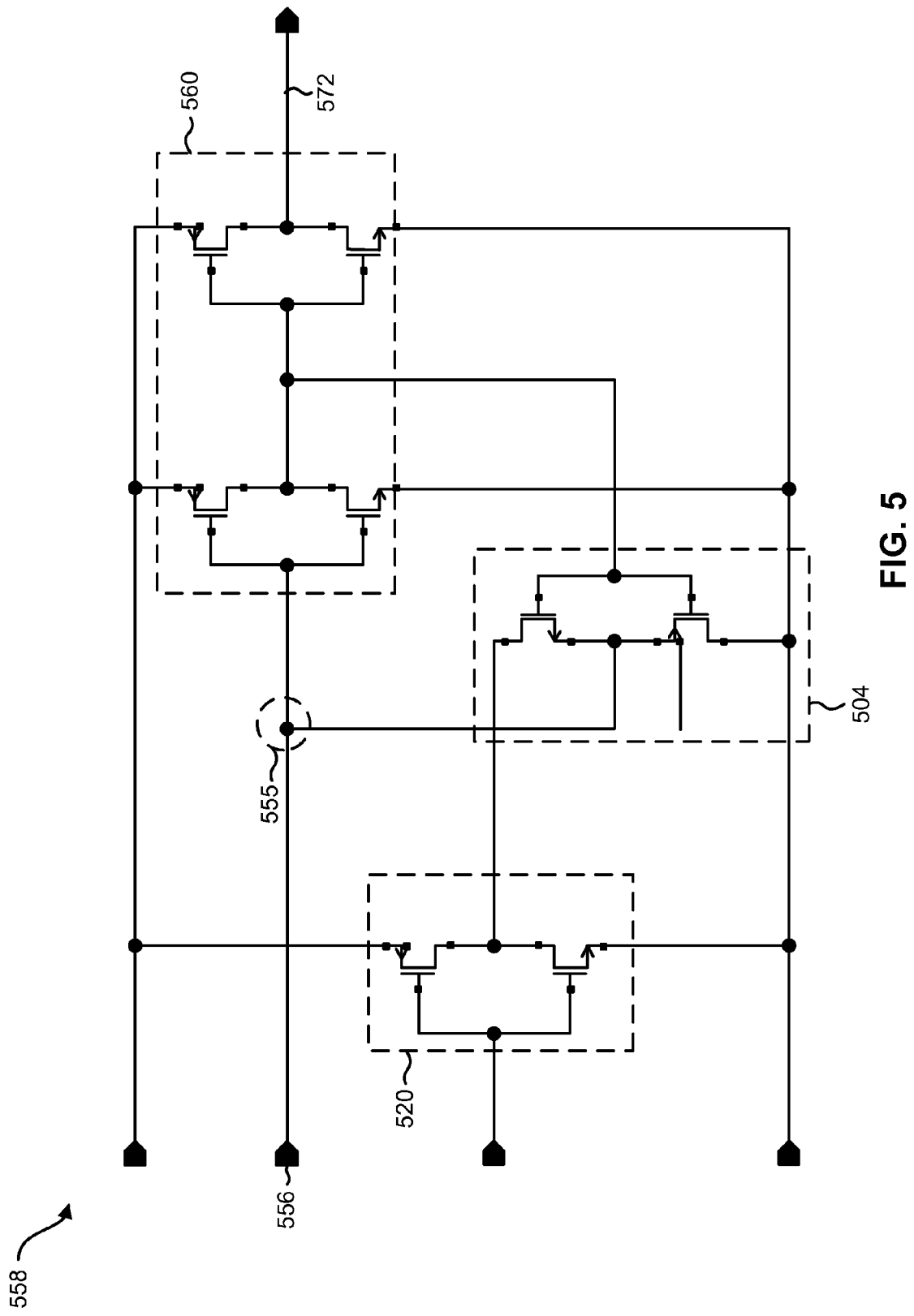
FIG. 5 is a schematic diagram illustrating one example of a clamp device that may be used in a receiver.

FIG. 5 is a schematic diagram illustrating one example of a clamp device 558 that may be used in a receiver 108 of the present systems and methods. The clamp 558 may extend the bandwidth (BW) (i.e., speed) of the receiver 108. The clamp 558 may bias an analog node 555 and clamp the output voltage swing to a small voltage range in order to keep devices in a receiver output stage in a saturation region. The clamp 588 may provide low impedance by including p-type metal-oxide-semiconductor (PMOS) field effect transistors and an n-type metal-oxide-semiconductor (NMOS) field effect transistors 504 in parallel. The low impedance from the parallel PMOS transistors and NMOS transistors 504 may be represented as 1/transconductance (gm).

In one configuration, the clamp uses an NMOS-PMOS push pull topology to provide the low impedance to a sensitive analog node 555 and bias the sensitive analog node 555. The low impedance and biasing of the sensitive analog node 555 may extend the bandwidth (BW) of the receiver 108. The clamp 558 may not add a gate cap on the sensitive analog node 580. Gate cap may be the capacitance looking into the gate of the MOS device. The input to the NMOS-PMOS transistors 504 may be the output of an output stage 556. In addition, an enabling device 520 may also be connected to the NMOS-PMOS transistors 504. The output of the output stage 556 may also be an input to an output buffer 560. The output buffer 560 may produce an output signal 572.

Figure 6:
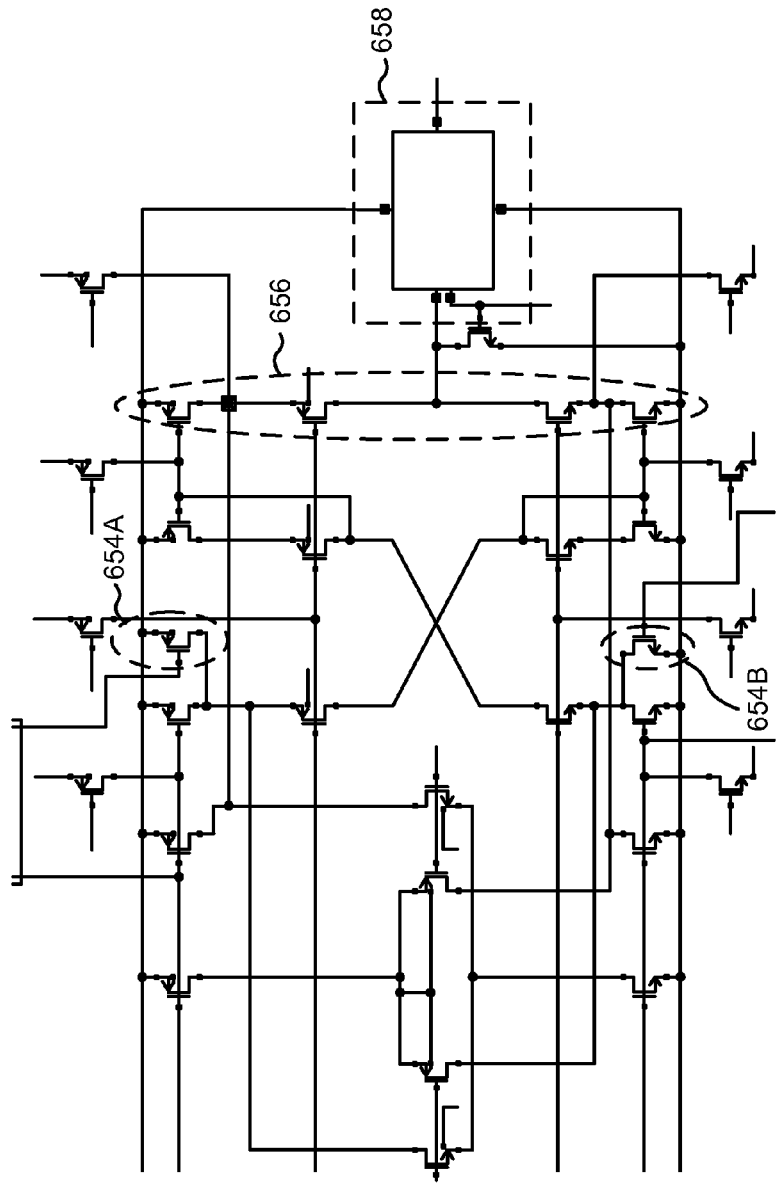
FIG. 6 is a schematic diagram illustrating one configuration of a programmable leakage device in a receiver.

FIG. 6 is a schematic diagram illustrating one configuration of a programmable leakage device 654A, 654B in a receiver 608. (Some portions of the receiver 608 are not shown in FIG. 6.) An output stage 656 and a clamp device 658 are also illustrated as points of reference. Leakage devices 654A, 654B imbalance the current ratio from input device pair to output stage 656 causing a small leakage current in the output stage PMOS/NMOS cascode transistor when they turn off. As previously mentioned, the programmable leakage devices 654A, 654B are used to assist the output stage 656 cascode devices to not enter a deep cut-off region. Cascading may be used to increase the output resistance of the amplifier which helps to improve the gain of the amplifier. An improved (i.e., higher) gain helps to eliminate any input offset voltage. Cascading may also be used to improve the signal to noise ratio.

Figure 7:
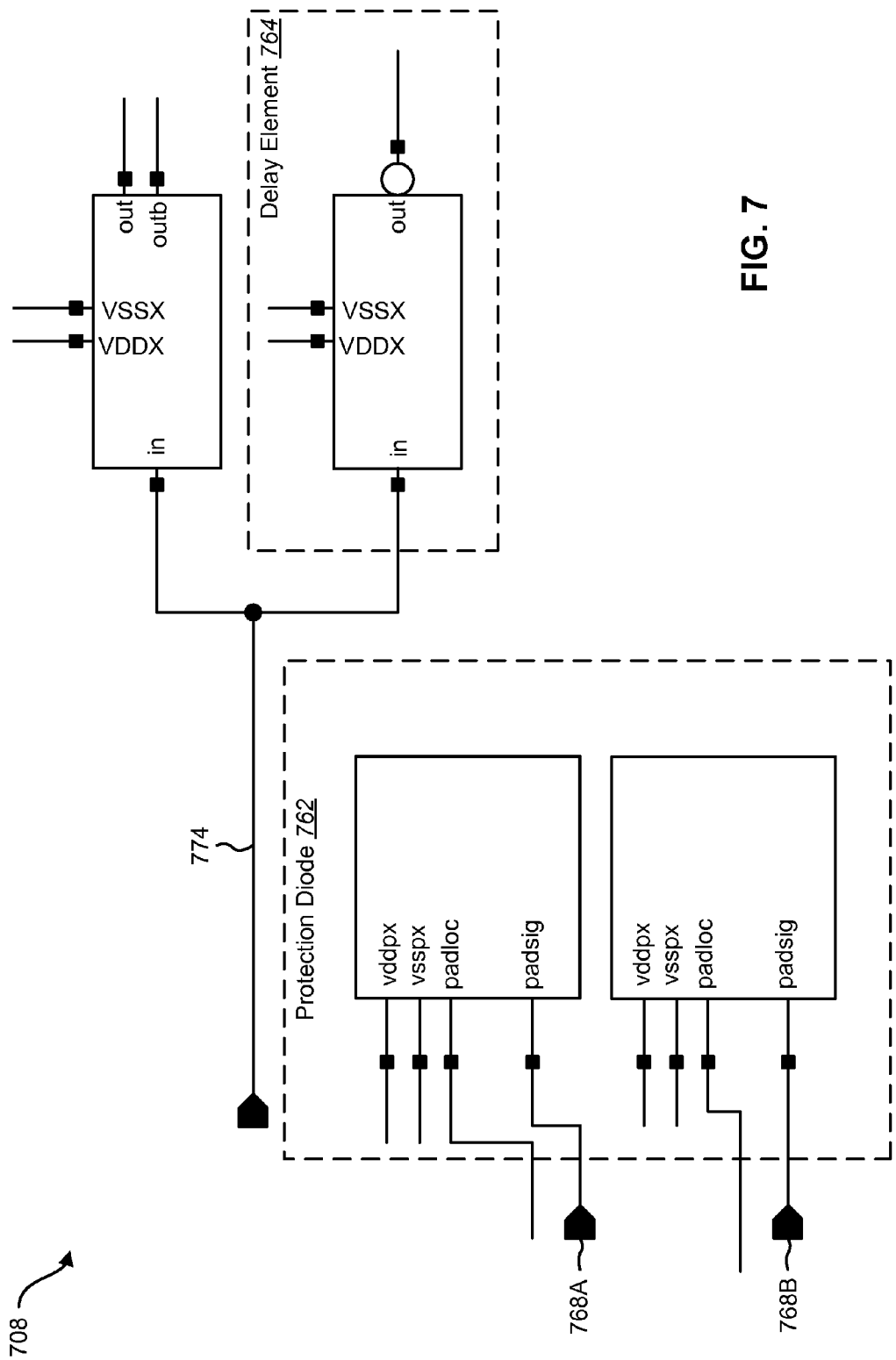
FIG. 7 is a schematic diagram illustrating one example of a protection diode and a delay element in a receiver.

FIG. 7 is a schematic diagram illustrating one example of a protection diode 762 and a delay element 764 in a receiver 708. (Some portions of the receiver 708 are not shown in FIG. 7.) As previously mentioned, the protection diode 762 may be an ESD protection diode. The protection diode 762 may protect receiver input pair transistors against damaging electrostatic discharge (ESD) pulses. Differential input signals 768A, 768B may be the input to the protection diode 762.

The delay element 764 may be an asymmetric delay element connected to a receiver enable signal 774. The delay element may be implemented with a chain of asymmetric inverters; the resulting low to high delay may be much larger than high to low delay. The delay element 764 may ensure that the output of the receiver 708 stays low during the power-up period of the receiver 708. The delay element 764 may clamp the receiver output low until the bias nodes settle to their respective quiescent values (i.e., steady state value).

Figure 8:
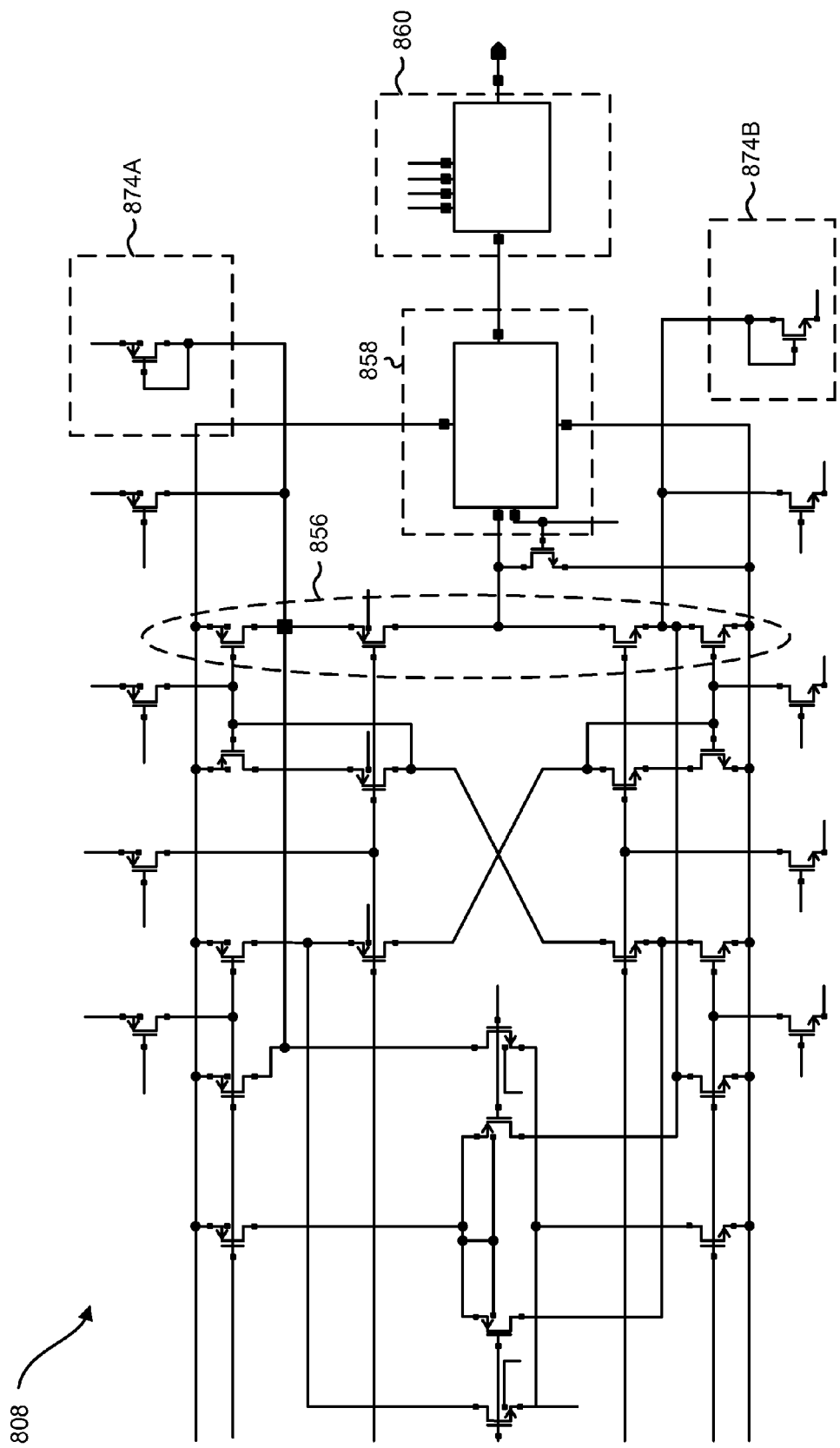
FIG. 8 is a schematic diagram illustrating one configuration of a diode device in a receiver.

FIG. 8 is a schematic diagram illustrating one configuration of diode devices 874A, 874B in a receiver 808. (Some portions of the receiver 808 are not shown in FIG. 8.) A clamp device 858, output stage 856 and output buffer 860 are also illustrated as a point of reference within the schematic. The diode devices 874A, 874B may replace the leakage current devices 354A, 354B. The diode devices 874A, 874B may be PMOS/NMOS devices connected in a diode configuration. The leakage current devices 354A, 354B may be a PMOS transistor and/or an NMOS transistor. Diode devices 874A, 874B perform the same function as programmable leakage devices 654A, 654B. As previously mentioned, the diode devices 874A, 874B may be used to assist the output stage 856 with cascode devices avoid entering into a deep cut-off region.

Figure 9:
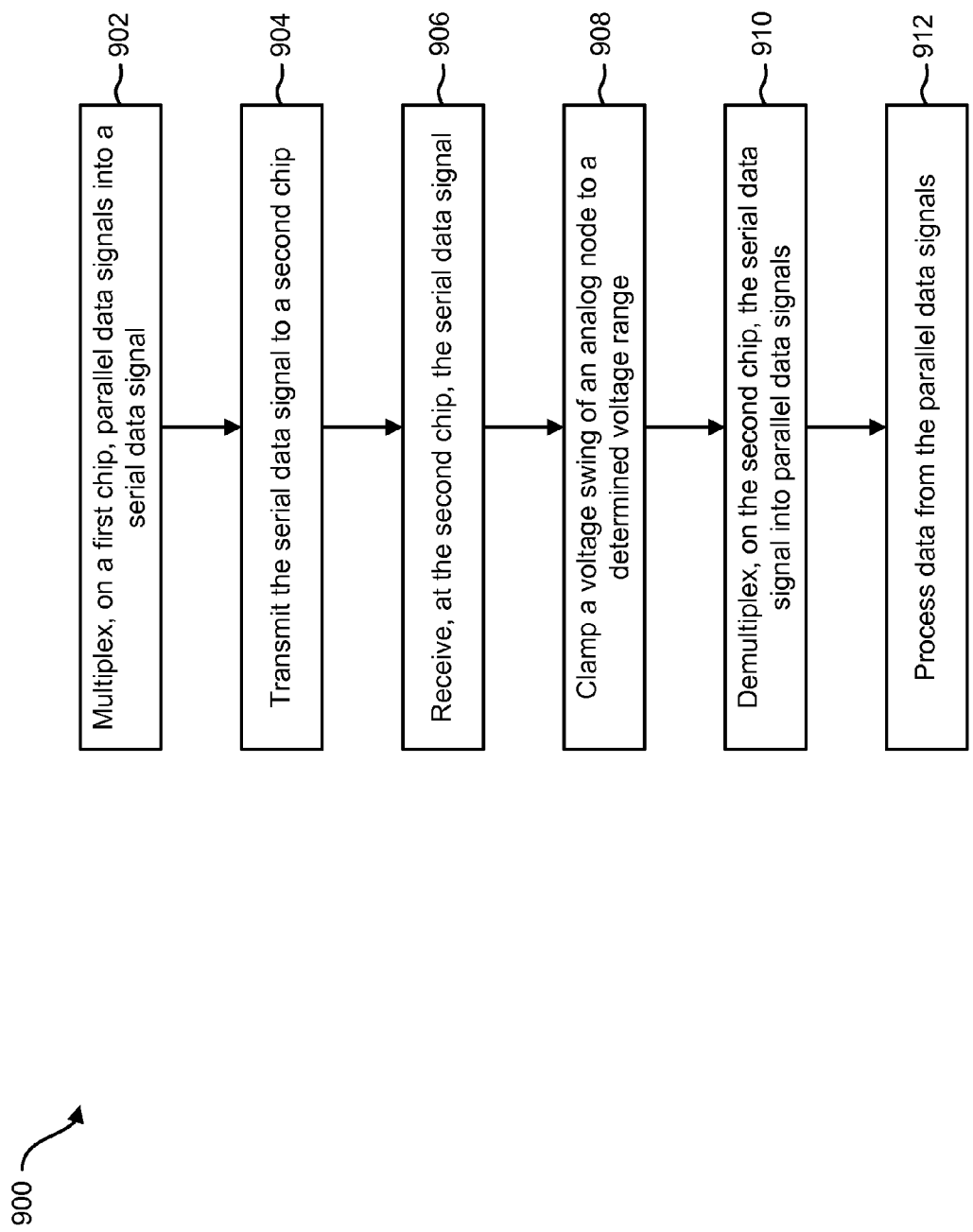
FIG. 9 is a flow diagram illustrating one example of a method for implementing a high speed, low power and low jitter differential receiver.

FIG. 9 is a flow diagram illustrating one example of a method 900 for implementing a high speed, low power and low jitter differential receiver 108. The method 900 may be implemented by a device 100, such as an electronic device, a mobile device, handheld device, etc. In one configuration, parallel data signals may be multiplexed 902 into a serial data signal. The parallel signals may be multiplexed 902 on a first chip. The first chip may be in a processing module 102, a sensor module 112, a display module 114, etc.

The serial data signal may be transmitted 904 to a second chip. The second chip may be located in a different module than the first chip. For example, the first chip may be located in the processing module 102 and the second chip may be located in the display module 114. In one configuration, the serial data signal may be received 906 at the second chip. A voltage signal associated with an analog node may be clamped 908. The signal may be clamped 908 to a determined voltage range. For example, the voltage signal may be clamped 908 by the clamp device 304 in order to maintain the output stage cascode devices in saturation.

In one configuration, the serial data signal may be demultiplxed 910 into parallel data signals. The demultiplexing 901 of the serial data signal may occur on the second chip. The parallel data signals may be processed 912 by a processor 216, such as a microprocessor.

Figure 10:
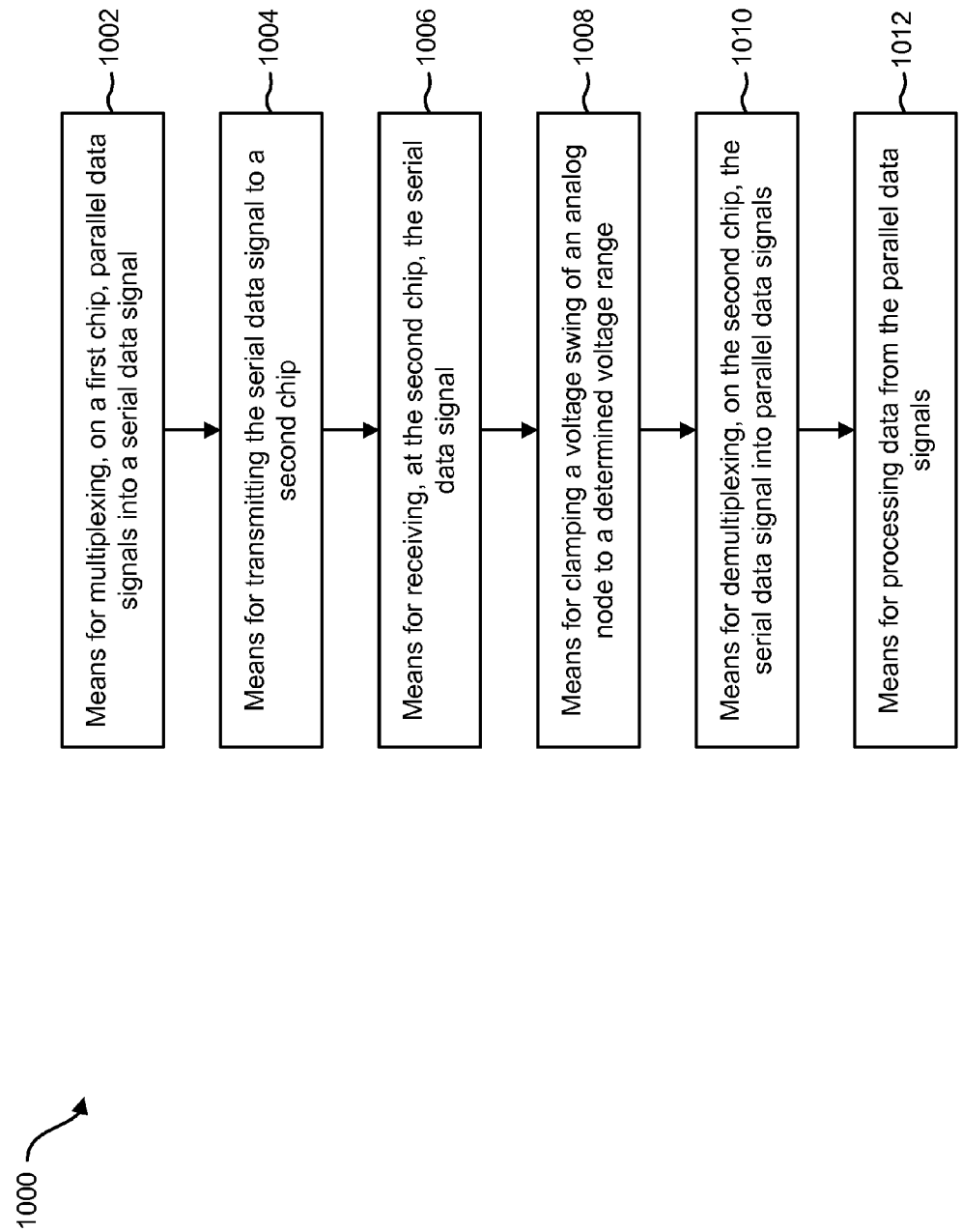
FIG. 10 illustrates means plus function blocks corresponding to the method shown in FIG. 9.

The method of FIG. 9 described above may be performed by various hardware and/or software component(s) and/or module(s) corresponding to the means-plus-function blocks illustrated in FIG. 10. In other words, blocks 902 through 912 illustrated in FIG. 9 correspond to means-plus-function blocks 1002 through 1012 illustrated in FIG. 10.

With the design techniques provided above, the receiver 108 may meet the design parameters previously specified. In one configuration, high performance (a quantity of gigabits per second (Gbps)) with low jitter is observed for an input voltage swing as low as 50 mV. The receiver 108 of the present systems and methods may also have a high common mode rejection ratio (CMRR). A high CMRR rejects common mode noise which may be high in a cellular phone where a radio generates a high level of noise. Using serial data lines (i.e., a single wire) to achieve data rates of at least several Gbps, saves space on the surface area of an integrated circuit and also saves package pins. The low power usage by the receiver 108 improves the power supply for the device 100. In one configuration, the receiver has off current in the range of about 5 to 10 nano-amps (nA). The enable time for the receiver 108 may be about 50 to 60 nanoseconds (ns), while the turn-off time may be less than 5 ns. A faster enable time may help to turn on the device 100 quickly. Data may be sent in a burst mode and the device 100 may be turned off quickly in order to save power.

Figure 11:
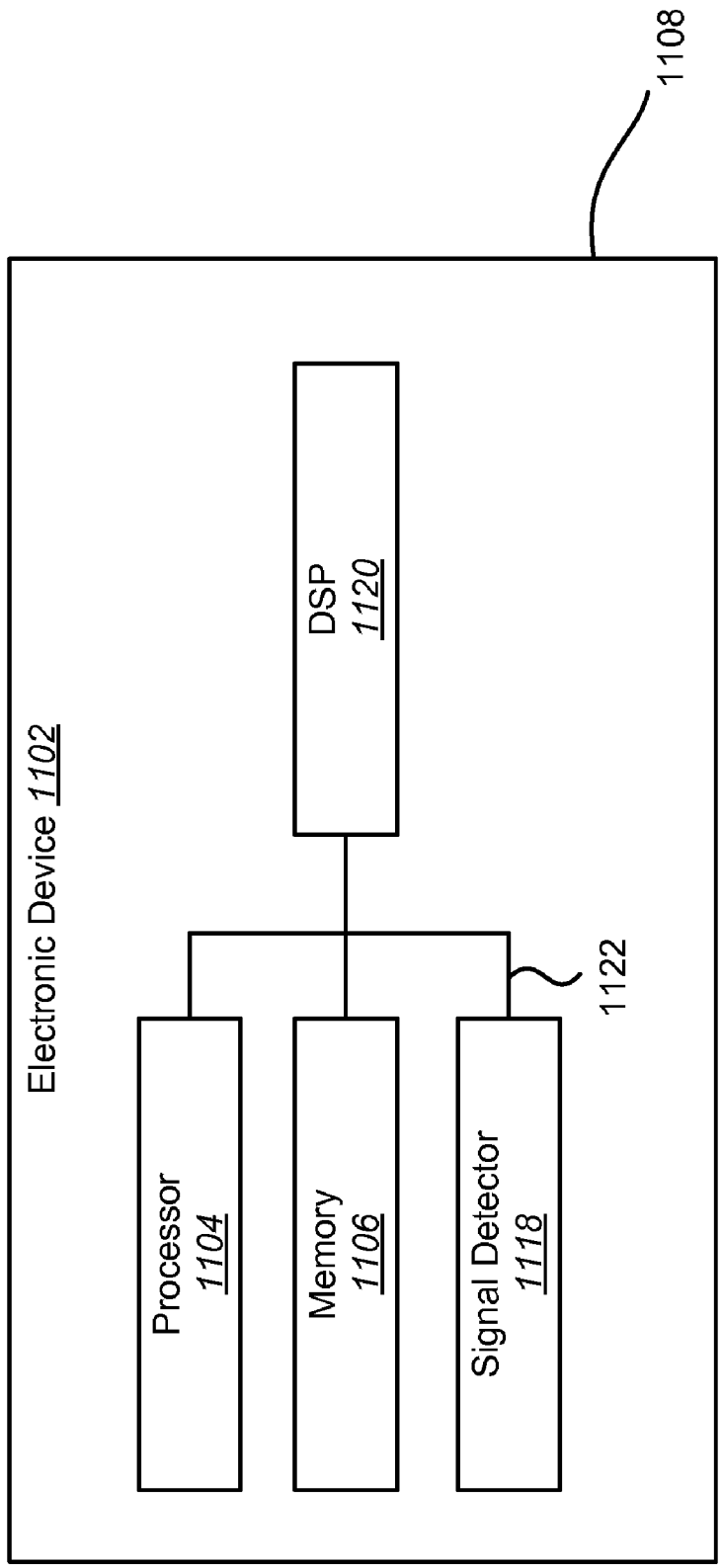
FIG. 11 illustrates various components that may be utilized in an electronic device.

FIG. 11 illustrates various components that may be utilized in an electronic device 1102. The electronic device 1102 is an example of a device that may be configured to implement the various systems and methods described herein. For example, the wireline receiver 108 disclosed herein may be a component of the device 1102. The device 1102 may be a mobile station, cellular phone, PDA, handheld device, satellite phone, laptop computing device, etc. The current systems and methods may be implemented in a wireless or non-wireless electronic device. Configurations of the devices without wireless capability may include a processor, memory, etc., but may not include a transceiver, signal detector or other components used to implement wireless capability.

The device 1102 may include a processor 1104 which controls operation of the electronic device 1102. The processor 1104 may also be referred to as a central processing unit (CPU). Memory 1106, which may include both read-only memory (ROM) and random access memory (RAM), provides instructions and data to the processor 1104. A portion of the memory 1106 may also include non-volatile random access memory (NVRAM). The processor 1104 typically performs logical and arithmetic operations based on program instructions stored within the memory 1106. The device 1102 may also include a housing 1108

The device 1102 may also include a signal detector 1118. The signal detector 1118 may detect such signals as total energy, pilot energy per pseudonoise (PN) chips, power spectral density, and other signals. The device 1102 may also include a digital signal processor (DSP) 1120 for use in processing signals.

The various components of the electronic device 1102 may be coupled together by a bus system 1122 which may include a power bus, a control signal bus, and a status signal bus in addition to a data bus. However, for the sake of clarity, the various busses are illustrated in FIG. 11 as the bus system 1122.

As used herein, the term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The various illustrative logical blocks, modules and circuits described in connection with the present disclosure may be implemented or performed with a general purpose processor, a digital signal processor (DSP), an application specific integrated circuit (ASIC), a field programmable gate array signal (FPGA) or other programmable logic device, discrete gate or transistor logic, discrete hardware components or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core or any other such configuration.

The steps of a method or algorithm described in connection with the present disclosure may be embodied directly in hardware, in a software module executed by a processor or in a combination of the two. A software module may reside in any form of storage medium that is known in the art. Some examples of storage media that may be used include RAM memory, flash memory, ROM memory, EPROM memory, EEPROM memory, registers, a hard disk, a removable disk, a CD-ROM and so forth. A software module may comprise a single instruction, or many instructions, and may be distributed over several different code segments, among different programs and across multiple storage media. A storage medium may be coupled to a processor such that the processor can read information from, and write information to, the storage medium. In the alternative, the storage medium may be integral to the processor.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in software, the functions may be stored as one or more instructions on a computer-readable medium. A computer-readable medium may be any available medium that can be accessed by a computer. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

Further, it should be appreciated that modules and/or other appropriate means for performing the methods and techniques described herein, such as those illustrated by FIGS. 9-10, can be downloaded and/or otherwise obtained by a mobile device and/or base station as applicable. For example, such a device can be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a mobile device and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. An electronic device comprising:
   a first integrated circuit (IC);
   a second integrated circuit (IC);
   a multiplexer configured to multiplex a parallel data signal into a serial data signal;
   a transmitter configured to transmit the serial data signal from the first IC to the second IC;
   a receiver configured to receive the serial data signal, the receiver comprising:

a clamp circuit configured to clamp the voltage swing of an analog node within a determined range to extend the bandwidth of the receiver.

2. The electronic device of claim 1, wherein the clamp circuit comprises a p-type metal-oxide-semiconductor (PMOS) transistor and an n-type metal-oxide-semiconductor (NMOS) transistor.

3. The electronic device of claim 2, wherein the clamp circuit further comprises an NMOS and PMOS push pull topology.

4. The electronic device of claim 3, wherein the NMOS and the PMOS push pull topology provides impedance equal to the reciprocal of the transconductance (gin) of the NMOS and the PMOS in parallel.

5. The electronic device of claim 1, wherein the receiver further comprises output stage devices configured to provide an adequate gain.

6. The electronic device of claim 5, wherein the determined range of the input swing is a range of voltage signals to maintain the output stage devices in saturation.

7. The electronic device of claim 1, wherein the receiver further comprises a programmable current leakage device configured to avoid cascode devices of the receiver entering a deep cut-off region.

8. The electronic device of claim 1, wherein the receiver further comprises a diode device configured to avoid cascode devices of the receiver entering a deep cut-off region.

9. The electronic device of claim 1, wherein the receiver further comprises a delay device configured to clamp the output of the receiver at a logic low.

10. The electronic device of claim 9, wherein the delay device is further configured to clamp the output of the receiver at a logic low until internal receiver nodes approach a corresponding quiescent point.

11. The electronic device of claim 9, wherein the delay device is further configured to clamp the output of the receiver at a logic low until the receiver bias current approaches a corresponding quiescent value.

12. The electronic device of claim 1, wherein the electronic device comprises a wireless device.

13. The electronic device of claim 12, wherein the wireless device comprises a handset.

14. A method for performing off-chip data communications, the method comprising:
   multiplexing parallel data signals into a serial data signal;
   transmitting the serial data signal from a first chip to a second chip;
   clamping a voltage swing associated with an analog node within a determined voltage range to extend the bandwidth of a receiver;
   demultiplexing the serial data signal into the parallel data signals; and
   processing the parallel data signals.

15. The method of claim 14, wherein clamping the voltage output swing is executed by a p-type metal-oxide-semiconductor (PMOS) transistor and an n-type metal-oxide-semiconductor (NMOS) transistor.

16. The method of claim 15, further comprising providing an NMOS and PMOS push pull topology.

17. The method of claim 16, further comprising providing an impedance equal to the reciprocal of the transconductance (gin) of the NMOS and the PMOS in parallel.

18. The method of claim 14, further comprising maintaining output stage devices of a receiver in saturation by clamping the voltage of an analog node within a determined voltage range.

19. The method of claim 18, further comprising preventing cascading devices of the output stage devices from entering a deep cut-off region.

20. The method of claim 14, further comprising clamping the output of a receiver at a logic low.

21. The method of claim 20, further comprising clamping the output of the receiver at the logic low until internal receiver nodes approach a corresponding quiescent point.

22. The method of claim 20, further comprising clamping the output of the receiver at the logic low until the receiver bias current approaches a corresponding quiescent value.

23. An apparatus comprising:
   means for multiplexing parallel data signals into a serial data signal;
   means for transmitting the serial data signal from a first chip to a second chip;
   means for clamping a voltage output swing associated with an analog node within a determined voltage range to extend the bandwidth of a receiver;
   means for demultiplexing the serial data signal into the parallel data signals; and
   means for processing the parallel data signals.

24. An integrated circuit for performing off-chip data communications, the integrated circuit comprising:
   a receiver configured to receive a serial data signal, the receiver comprising:
      a clamp circuit configured to bias an analog node within the receiver and clamp a voltage swing associated with the analog node within a determined voltage range and to extend the bandwidth of the receiver;
      a programmable current leakage circuit configured to prevent cascode output stage devices of the receiver from entering a deep cut-off region; and
      a delay element configured to clamp the output of the receiver at a logic low until internal receiver nodes approach a corresponding quiescent point and the receiver bias current approaches a quiescent value.

25. The apparatus of claim 23, further comprising means for providing an NMOS and PMOS push pull topology.

26. The apparatus of claim 25, further comprising means for providing an impedance equal to the reciprocal of the transconductance (gin) of the NMOS and the PMOS in parallel.

27. The apparatus of claim 23, further comprising means for maintaining output stage devices of a receiver in saturation by clamping the voltage of an analog node within a determined voltage range.

28. The apparatus of claim 27, further comprising means for preventing cascading devices of the output stage devices from entering a deep cut-off region.

29. The apparatus of claim 23, further comprising means for clamping the output of a receiver at a logic low.

30. The apparatus of claim 29, further comprising means for clamping the output of the receiver at the logic low until internal receiver nodes approach a corresponding quiescent point.

31. The apparatus of claim 29, further comprising means for clamping the output of the receiver at the logic low until the receiver bias current approaches a corresponding quiescent value.

* * * * *